(12) United States Patent
Swan et al.

(10) Patent No.: US 11,615,998 B2
(45) Date of Patent: Mar. 28, 2023

(54) THERMAL MANAGEMENT SOLUTIONS FOR EMBEDDED INTEGRATED CIRCUIT DEVICES

(71) Applicant: Intel Corporation, Santa Clara, CA (US)

(72) Inventors: Johanna Swan, Scottsdale, AZ (US); Feras Eid, Chandler, AZ (US); Adel Elsherbini, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 854 days.

(21) Appl. No.: 16/129,243

(22) Filed: Sep. 12, 2018

(65) Prior Publication Data

US 2020/0083135 A1 Mar. 12, 2020

(51) Int. Cl.
*H01L 23/367* (2006.01)
*H01L 23/498* (2006.01)
*H01L 23/42* (2006.01)
*H01L 23/00* (2006.01)
*H01L 21/48* (2006.01)

(52) U.S. Cl.
CPC ........ *H01L 23/367* (2013.01); *H01L 21/4857* (2013.01); *H01L 23/42* (2013.01); *H01L 23/49822* (2013.01); *H01L 23/49838* (2013.01); *H01L 24/81* (2013.01); *H01L 24/16* (2013.01); *H01L 2224/16227* (2013.01); *H01L 2224/81815* (2013.01)

(58) Field of Classification Search
CPC ... H01L 23/367; H01L 21/4857; H01L 23/42; H01L 23/49822; H01L 23/49838; H01L 24/81; H01L 24/16; H01L 2224/16227; H01L 2224/81815
See application file for complete search history.

(56) References Cited

U.S. PATENT DOCUMENTS

| | | | | |
|---|---|---|---|---|
| 6,219,243 | B1 * | 4/2001 | Ma .......................... | H01L 23/36 257/706 |
| 2010/0001410 | A1 * | 1/2010 | Kang .................... | H01L 23/562 257/778 |
| 2012/0126387 | A1 * | 5/2012 | Fishley ............... | H01L 23/3128 257/690 |
| 2012/0171814 | A1 * | 7/2012 | Choi ................... | H01L 23/3128 438/107 |
| 2015/0214128 | A1 * | 7/2015 | Lin ...................... | H01L 21/563 257/712 |
| 2018/0226366 | A1 * | 8/2018 | Kim ...................... | H01L 21/56 |
| 2018/0331009 | A1 * | 11/2018 | Wang .................. | H01L 27/1203 |
| 2019/0189572 | A1 * | 6/2019 | Chiang ................ | H01Q 1/2283 |
| 2020/0067459 | A1 * | 2/2020 | Ahmed ............ | H01L 23/49811 |
| 2021/0202377 | A1 * | 7/2021 | Elsherbini ......... | H01L 21/76816 |

* cited by examiner

*Primary Examiner* — Douglas W Owens
(74) *Attorney, Agent, or Firm* — Essential Patents Group, LLP.

(57) ABSTRACT

An integrated circuit structure may be formed having a substrate, at least one integrated circuit device embedded in and electrically attached to the substrate, and a heat dissipation device in thermal contact with the integrated circuit device, wherein a first portion of the heat dissipation device extends into the substrate and wherein a second portion of the heat dissipation device extends over the substrate. In one embodiment, the heat dissipation device may comprise the first portion of the heat dissipation device formed from metallization within the substrate.

16 Claims, 9 Drawing Sheets

THERMAL MANAGEMENT SOLUTIONS FOR EMBEDDED INTEGRATED CIRCUIT DEVICES

TECHNICAL FIELD

Embodiments of the present description generally relate to the removal of heat from integrated circuit devices, and, more particularly, to thermal management solutions for integrated circuit devices that are embedded in substrates.

BACKGROUND

Higher performance, lower cost, increased miniaturization, and greater packaging density of integrated circuits within integrated circuit devices are ongoing goals of the electronics industry. As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. This issue becomes even more critical when integrated circuit devices are embedded in the substrate to which they are electrically connected in the formation of an integrated circuit package.

Integrated circuit packages with substrate-integrated devices, such as bumpless build-up layer package or fan-out packages, are options for decreasing the thickness or Z-height of the integrated circuit package. Instead of a traditional flip chip package wherein integrated circuit devices are assembled on a surface of a substrate using interconnects, such as solder bumps or balls, the integrated circuit devices are embedded inside the substrate or mold layer, and/or at least some of the package redistribution layers are formed directly over the integrated circuit device (e.g. the wafer level, the reconstituted wafer level, or the panel level). Such integrated circuit packages with substrate-integrated devices can allow for thinner form factors and better system-in-package (SiP) integration compared to their traditional flip-chip package counterparts.

As will be understood to those skilled in the art, when the integrated circuit device is embedded in the substrate, there is no exposed surface of the integrated circuit device to attach a heat dissipation device, such as a heat spreader and/or an active cooling solution. Thus, the internally positioned integrated circuit device may exceed its temperature limit and be damaged or destroyed, leading to the failure of the entire integrated circuit package.

One option to mitigate this thermal issue is to use integrated circuit devices having thermal throttling control that are capable of reducing their operating frequency and, thus, their power in order to operate at a lower temperature and avoid failures. However, this results in a lower overall performance.

Another option to mitigate thermal issues is to use low-power integrated circuit devices in the substrate that did not require heat dissipation. However, higher power integrated circuit devices are excluded and may have to be attached to the substrate in the traditional manner, leading to increase thickness of the integrated circuit package.

Another option is to use metal layers within the substrate for heat dissipation. However, this is generally not sufficiently efficient due to the thinness of the metal layers compared to a traditional heat dissipation device.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description may include an integrated circuit structure having a substrate, at least one integrated circuit device embedded in and electrically attached to the substrate, and a heat dissipation device in thermal contact with the integrated circuit device, wherein a first portion of the heat dissipation device extends into the substrate and wherein a second portion of the heat dissipation device extends over the substrate. In one embodiment, the heat dissipation device may comprise the first portion of the heat dissipation device formed from metallization within the substrate.

Figure 1:
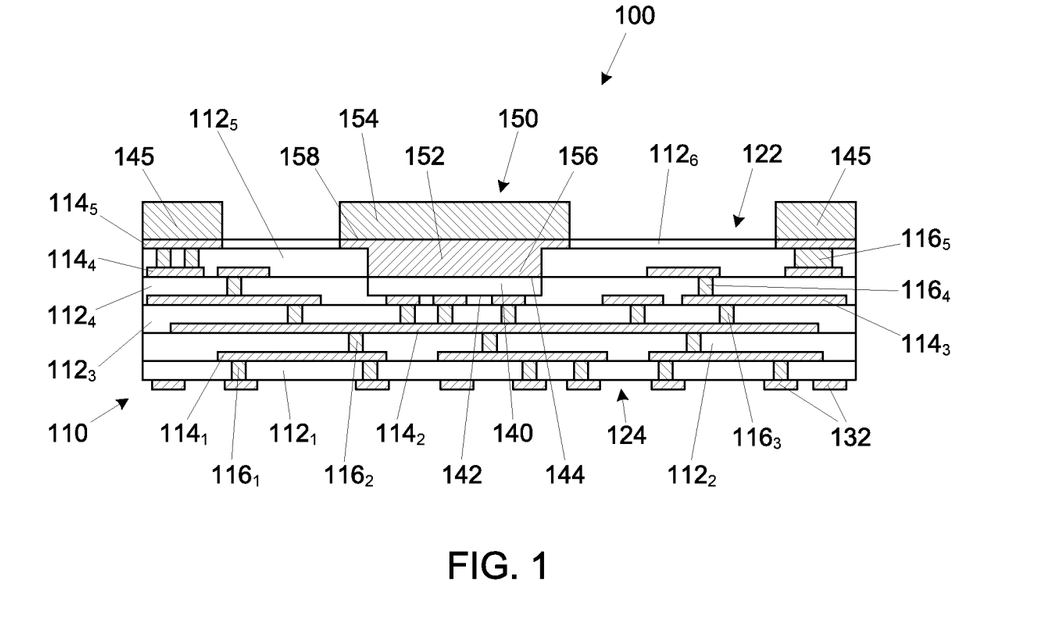
FIGS. 1-3 are side cross-sectional views of integrated circuit structures having an integrated circuit device embedded in a substrate, wherein a heat dissipation device comprises a portion thereof formed of metal layer within the substrate and another portion thereof formed external to the substrate, according to an embodiment of the present description.

FIG. 1 illustrates an integrated circuit package 100 having an integrated circuit device 140 embedded in a substrate 110, according to an embodiment of the present description. As shown in FIG. 1, the substrate 110 may be formed with a plurality of dielectric material layers $112_1$-$112_6$ and a plurality of conductive routes, such as conductive traces $114_1$-$114_5$ formed in or on the dielectric material layers $112_1$-$112_6$, respectively, which are connected with conductive vias $116_1$-$116_5$. These conduction routes may be referred to herein as "metallization". The substrate 110 may further include a plurality of bond pads 132 in or on a second surface 124 of the substrate 110, wherein the bond pads 132 may be in electrical contact with the metallization, i.e. through the conductive vias $116_1$ to the conductive traces $114_1$. As will be understood to those skilled in the art, the bond pads 132 may be used to form interconnects (not shown) thereon, such as solder balls, to connect the integrated circuit package 100 to external components (not shown), such as a motherboard.

The substrate 110 may be any appropriate structure, including, but not limited to, an interposer, a printed circuit board, a motherboard, and the like. The dielectric material layers $112_1$-$112_6$ of the substrate 110 may be composed of an appropriate dielectric material, including, but not limited to, bismaleimide triazine resin, fire retardant grade 4 material, polyimide materials, glass reinforced epoxy matrix material, silica filled epoxy, and the like, as well as laminates or multiple layers thereof. The metallization, e.g. the conductive traces $114_1$-$114_5$ and the conductive vias $116_1$-$116_5$ may be composed of any conductive material, including but not limited to metals, such as copper and aluminum, and alloys thereof. As will be understood to those skilled in the art, the substrate 110 may be either a cored or a coreless substrate.

In one embodiment, the integrated circuit device 140 may be embedded in the substrate 110 during the fabrication thereof, such that a first surface 142 of the integrated circuit device 140 is directly electrically attached to the metallization (shown as being attached to conductive traces $114_3$) in the substrate 110. The integrated circuit device 140 may be any appropriate device, including, but not limited to a microprocessor, a chipset, a graphics device, a wireless device, a memory device, an application specific integrated circuit, combinations thereof, stacks thereof, or the like. The processes for layering the dielectric material layers $112_1$-$112_6$ and for the attachment of the integrated circuit device 140 to the metallization are well known in the art and for purposes of brevity and conciseness will not be described herein. For the purposes of the present description, the term "embedded" is defined to mean that the integrated circuit device 140 is positioned between a first surface 122 of the substrate 110 and the second surface 124 of the substrate 110.

As shown in FIG. 1, the integrated circuit package 100 may include a heat dissipation device 150, which may comprise a first portion 152 extending into the substrate 110 and a second portion 154 external to and extending above the substrate 110. The first portion 152 of the heat dissipation device 150 may be formed during the formation of the metallization within the substrate 110, such as the formation of the conductive vias $116_5$ and/or the formation of the conductive traces $114_5$. In one embodiment, the first portion 152 of the heat dissipation device 150 may comprise multiple layers of metallization. The second portion 154 of the heat dissipation device 150 may be formed by any appropriate process, including, but not limited to, an additive process, a modified semi-additive process, and a semi-additive build-up process with advanced lithography. In one embodiment, the second portion 154 of the heat dissipation device 150 may be formed by screen printing. In another embodiment, the second portion 154 of the heat dissipation device 150 may be formed by a cold-spray process. The first portion 152 of the heat dissipation device 150 and the second portion 154 of the heat dissipation device 150 may be made of any appropriation thermally conductive material, including metals (such as copper, silver, gold, nickel, aluminum, and alloys thereof), metal/ceramic composites (such as aluminum/aluminum oxide), or from any other appropriate materials and combinations thereof.

In one embodiment, a lower surface 156 of the first portion 152 of the heat dissipation device 150 may contact a second surface 144 (opposing the first surface 142) of the integrated circuit device 140. In another embodiment, an upper surface 158 of the first portion 152 of the heat dissipation device 150 may be substantially planar with the second surface 124 of the substrate 110. In various embodiments, the first portion 152 of the heat dissipation device 150 may be made for the same or different material from that of the second portion 154 of the heat dissipation device 150.

As further shown in FIG. 1, stiffener structures 145 may be formed simultaneously with the formation of the second portion 154 of the heat dissipation device 150. As will be understood to those skilled in the art, the components and materials of the substrate may have differing coefficients of thermal expansion. The fundamental differences in the thermal expansion of these components and materials may result in temperature dependent deformation or warpage of the substrate 110. The stiffener structures 145 in conjunction with the metallization (i.e. conductive traces $114_4$, $114_5$ and conductive vias $116_5$) to which they are attached may assist in compensating for this warpage.

Figure 2:
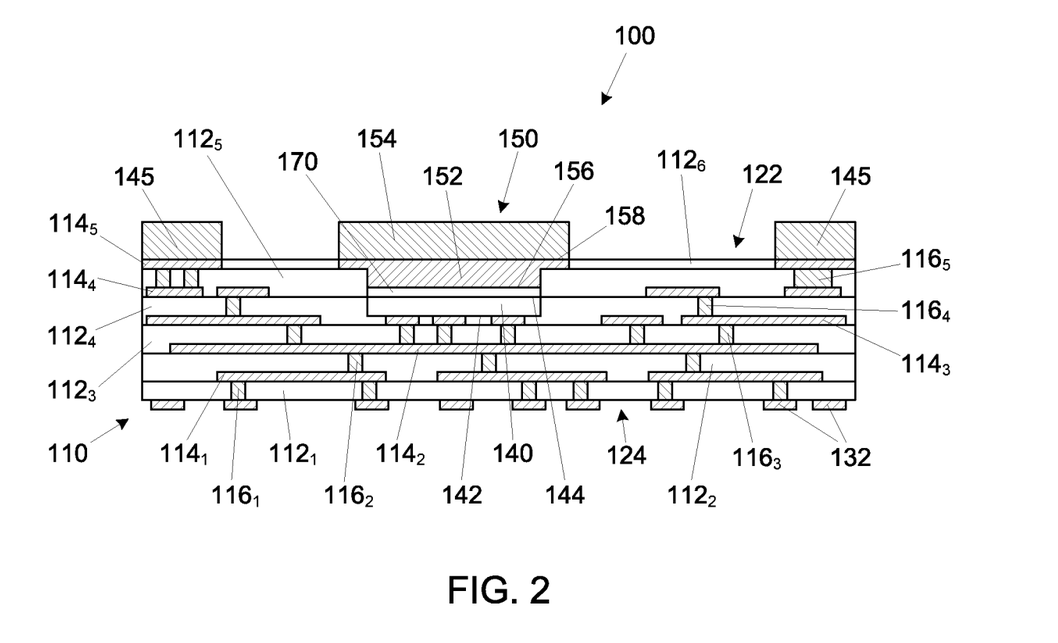

As will be understood to those skilled in the art, the material used for the first portion 152 of the heat dissipation device 150 may migrate, such that it can be detrimental to the integrated circuit device 140. Therefore, in one embodiment, a barrier material layer 170 may be formed between the first portion 152 of the heat dissipation device 150 and the integrated circuit device 140 to prevent this migration, as shown in FIG. 2. The barrier material layer 170 may be any appropriate material, including, but not limited to, refractory metal nitrides, such as titanium nitride, tantalum nitride, and titanium zirconium nitride.

Figure 3:
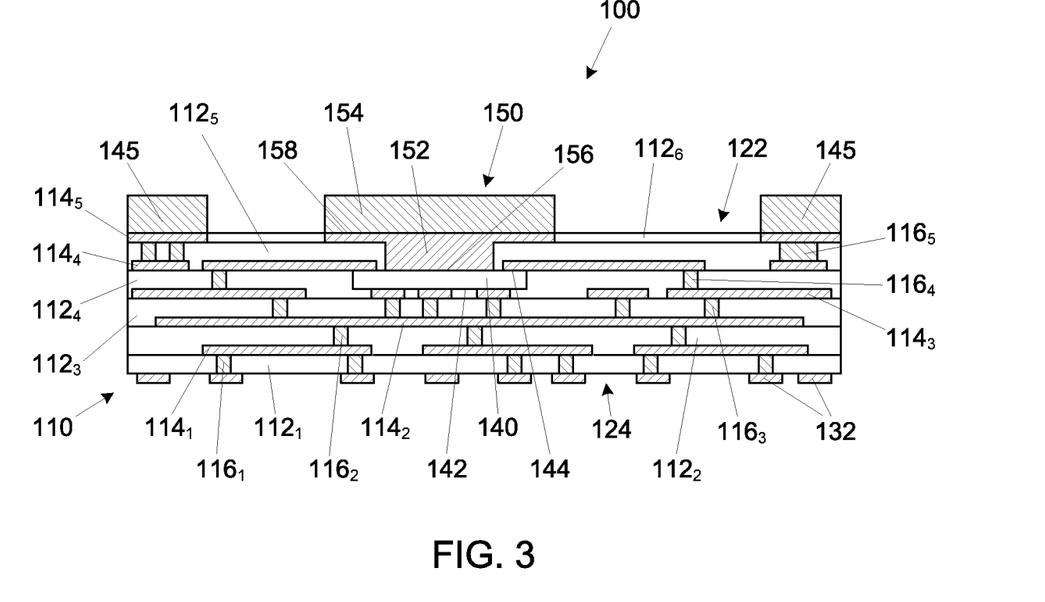

As shown in FIG. 3, the first portion 152 of the heat dissipation device 150 may be shaped to allow for the metallization (i.e. conductive trace $114_4$) to electrically contact the second surface 144 (opposing the first surface 142) of the integrated circuit device 140. Alternately, in other embodiments, the integrated circuit device 140 may have electrical features on the second surface 144 or on both the first surface 142 and the second surface 144 (as shown in FIG. 3). In one embodiment, the integrated circuit device 140 may be electrically connected to the metallization within the substrate 110 at the first surface 142 (illustrated as connected to trace layer $114_3$) of the integrated circuit device 140 and at the second surface 144 (illustrated as connected to trace layer $114_4$) of the integrated circuit device 140. In one embodiment, the connection to the metallization at either the first surface 142 or the second surface 144 may be achieved with bond pads (not shown) thereon, which are in electrical communication with integrated circuitry (not shown) within the integrated circuit device 140. In another embodiment, the connection to the metallization at either the first surface 142 or the second surface 144 may be achieved with through-silicon vias (not shown) thereon, which are in electrical communication with integrated circuitry (not shown) within the integrated circuit device 140.

Figure 4:
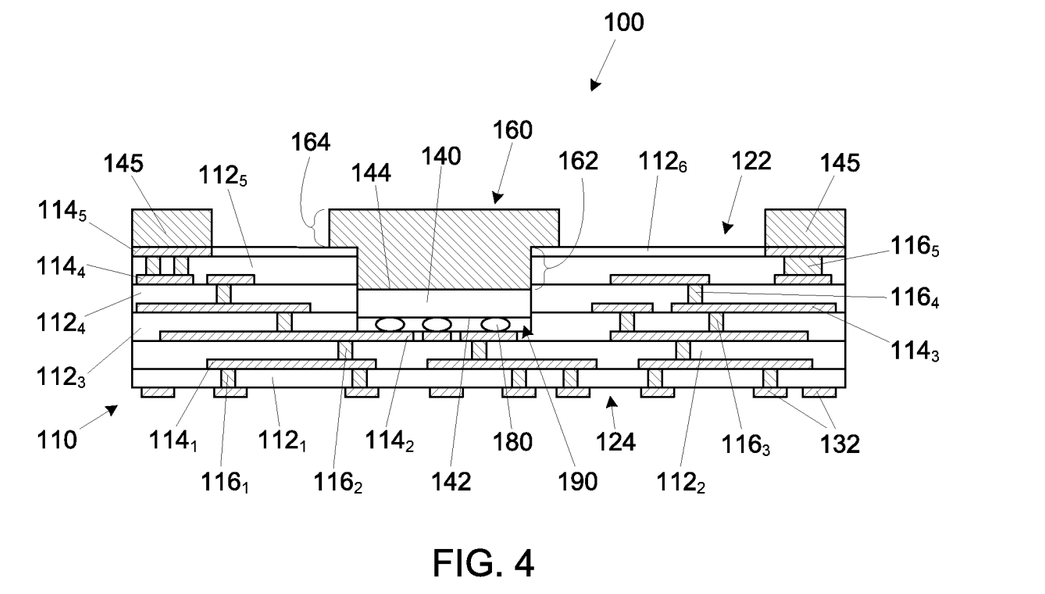
FIGS. 4-8 are side cross-sectional views of integrated circuit structures having an integrated circuit device embedded in a substrate, wherein a heat dissipation device is formed to extend into the substrate to thermally contact the integrated circuit device, according to an embodiment of the present description.

In a further embodiment of the present description shown in FIG. 4, the integrated circuit package 100 may have the integrated circuit device 140 embedded in the substrate 110 after the formation of the substrate 110. As shown in FIG. 4, after the formation of the substrate 110, a cavity 190 may be formed to extend in the substrate 110 from the first surface 122 thereof (shown extending through dielectric layers $112_3$-$112_6$ to the conductive traces $114_2$). The first surface 142 of the integrated circuit device 140 may be electrically attached to the metallization (e.g. conductive traces $114_2$) through the plurality of device-to-substrate interconnects 180, such as reflowable solder bumps or balls, in a configuration generally known as a flip-chip or controlled collapse chip connection ("C4") configuration. The device-to-substrate interconnects 180 may extend from bond pads (not shown) on first surface 142 of the integrated circuit device 140 and the metallization (e.g. conductive traces $114_2$). The integrated circuit device bond pads (not shown) of the integrated circuit devices 140 may be in electrical communication with circuitry (not shown) within the integrated circuit device 140.

The device-to-substrate interconnects 180 are not limited to solder bumps or balls, as illustrated, but may also be formed through direct copper-to-copper contacts or through conductive adhesive. However, when solder materials are used, they may be any appropriate material, including, but not limited to, tin, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. The solder may be reflowed, either by heat, pressure, and/or sonic energy to secure the device-to-substrate interconnects 180.

As shown in FIG. 4, the integrated circuit package 100 may include a heat dissipation device 160, which may comprise a first portion 162 extending into the cavity 190 of the substrate 110 and a second portion 164 external to and extending above the substrate 110. The heat dissipation device 160 may be formed by any appropriate process, including, but not limited to, an additive process, a modified semi-additive process, and a semi-additive build-up process with advanced lithography. In one embodiment, the heat dissipation device 160 may be formed by screen printing. In another embodiment, the heat dissipation device 160 may be formed by a cold-spray process. The heat dissipation device 160 may be made of any appropriation thermally conductive material, including metals (such as copper, silver, gold, nickel, aluminum, and alloys thereof), metal/ceramic composites (such as aluminum/aluminum oxide), or from any other appropriate materials and combinations thereof.

As further shown in FIG. 4, stiffener structures 145 may be formed simultaneous with the formation of the heat dissipation device 160. The stiffener structures 145 in conjunction with the metallization (i.e. conductive traces $114_4$, $114_5$ and conductive vias $116_5$) to which they are attached may assist in compensating for this warpage, as previously discussed.

Figure 5:
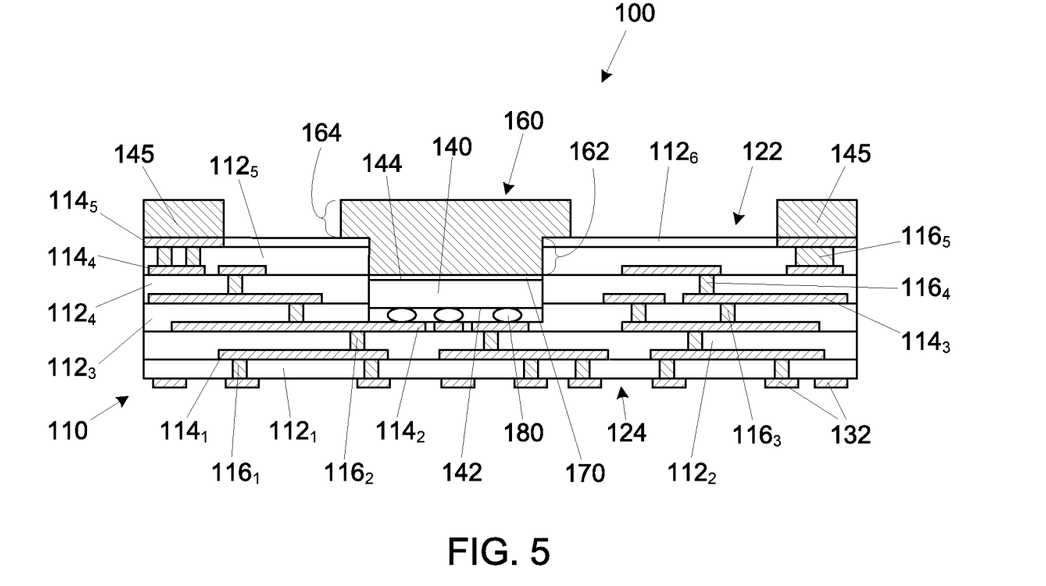

As will be understood to those skilled in the art, the material used for the heat dissipation device 160 may migrate such that it can be detrimental to the integrated circuit device 140. Therefore, in one embodiment, the barrier material layer 170 may be formed between the heat dissipation device 160 and the integrated circuit device 140 to prevent this migration, as shown in FIG. 5. The barrier material layer 170 may be any appropriate material, including, but not limited to, refractory metal nitrides, such as titanium nitride, tantalum nitride, and titanium zirconium nitride.

Figure 6:
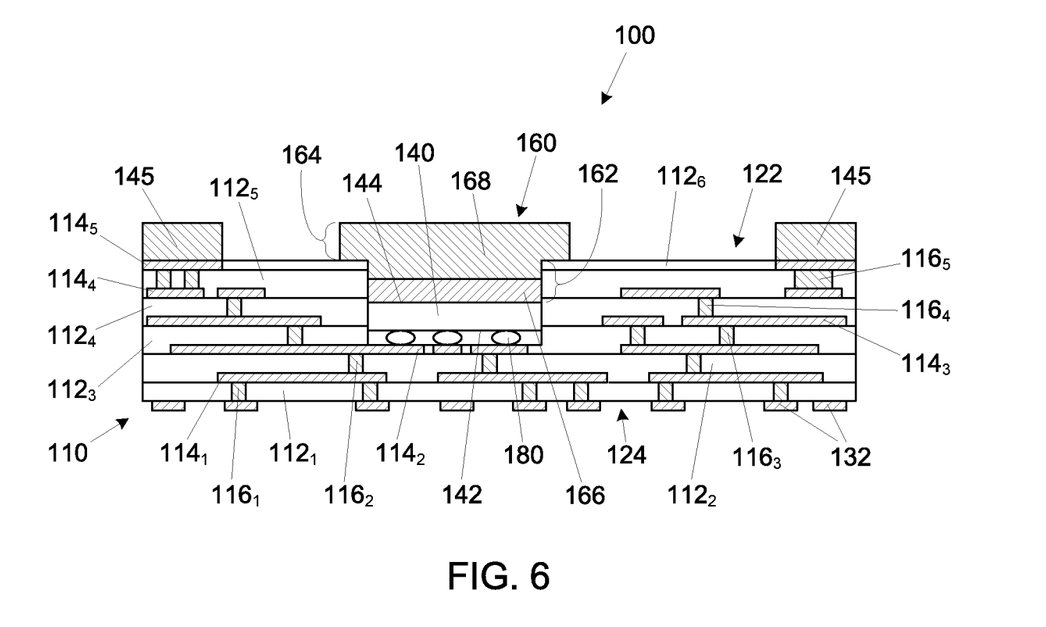

In an alternate embodiment shown in FIG. 6, rather than using the barrier material layer 170, the heat dissipation device 160 may comprise a first thermally conductive material layer 166 and a second thermally conductive material layer 168, wherein the first thermally conductive material layer 166 is disposed between the integrated circuit device 140 and the second thermally conductive material layer 168, and wherein the first thermally conductive material layer 166 prevents to second conductive material layer 168 from migrating into the integrated circuit device 140. In one embodiment, the first thermally conductive material 166 may comprise a migration resistant material, such as aluminum, and the second thermally conductive material 168 may comprise a migration prone material, such as copper.

Figure 7:
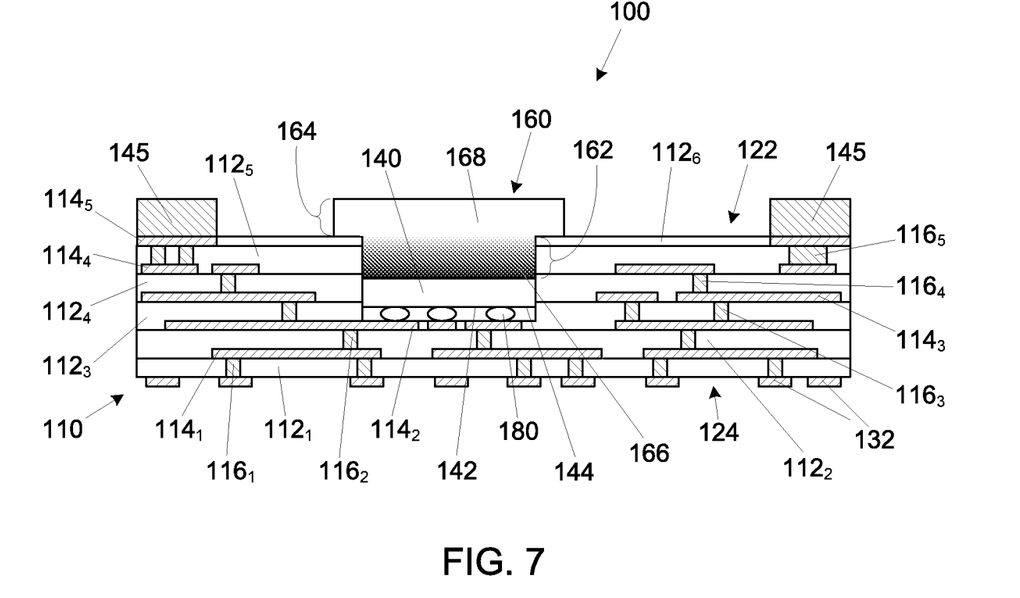

In a further embodiment, the first thermally conductive material layer 166 and a second thermally conductive material layer 168 shown in FIG. 7 may be graded through the heat dissipation device 160. In specific, the heat dissipation device 160 may comprise both a migration resistant material (such as aluminum) and migration prone material (such as copper), wherein the first thermally conductive material layer 166 may be a predominately migration resistant material proximate the integrated circuit device 140 then transition into predominately migration prone material in the second thermally conductive material layer 166. As will be understood to those skilled in the art, the grading may be achieved by adjusting the composition of the materials during the formation of the heat dissipation device 160.

Figure 8:
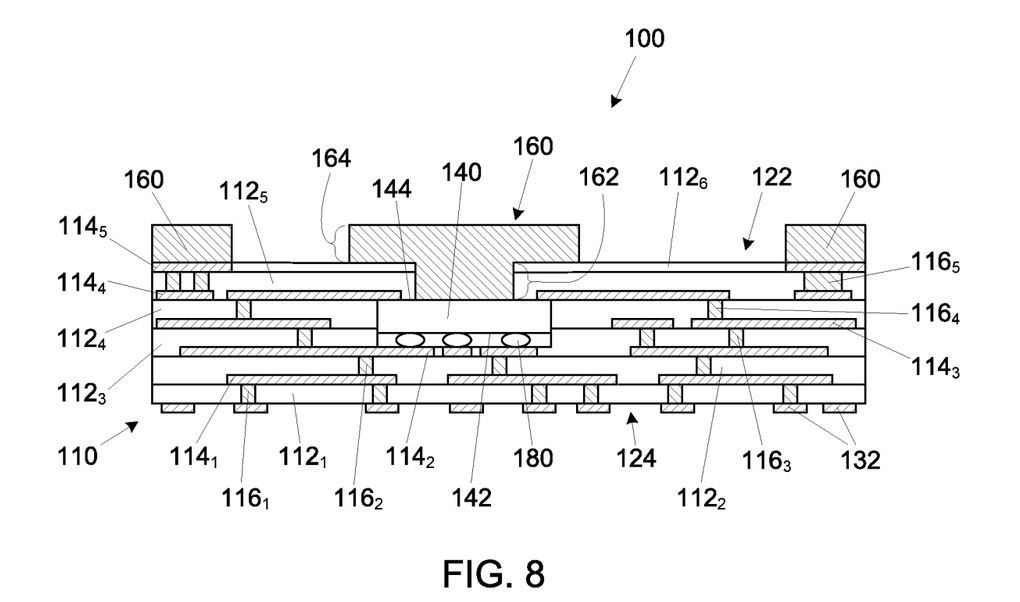

As shown in FIG. 8, the heat dissipation device 160 may be shaped to allow for the metallization (i.e. conductive trace $114_4$) to electrically contact the second surface 144 (opposing the first surface 142) of the integrated circuit device 140, as discussed with regard to the embodiment shown in FIG. 3.

Figure 9:
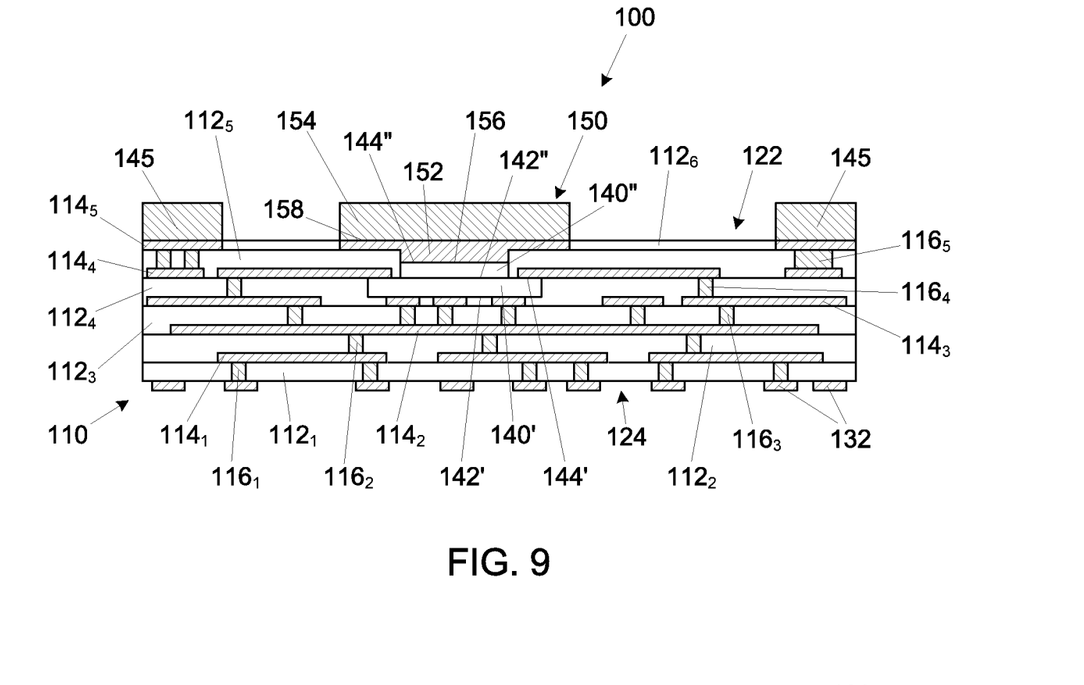
FIGS. 9 and 10 are a side cross-sectional view and a top view, respectively, of integrated circuit structures having multiple integrated circuit devices in a stacked configuration embedded in a substrate, wherein a heat dissipation device is formed to extend into the substrate to thermally contact the integrated circuit device stack, according to an embodiment of the present description.
Figure 10:
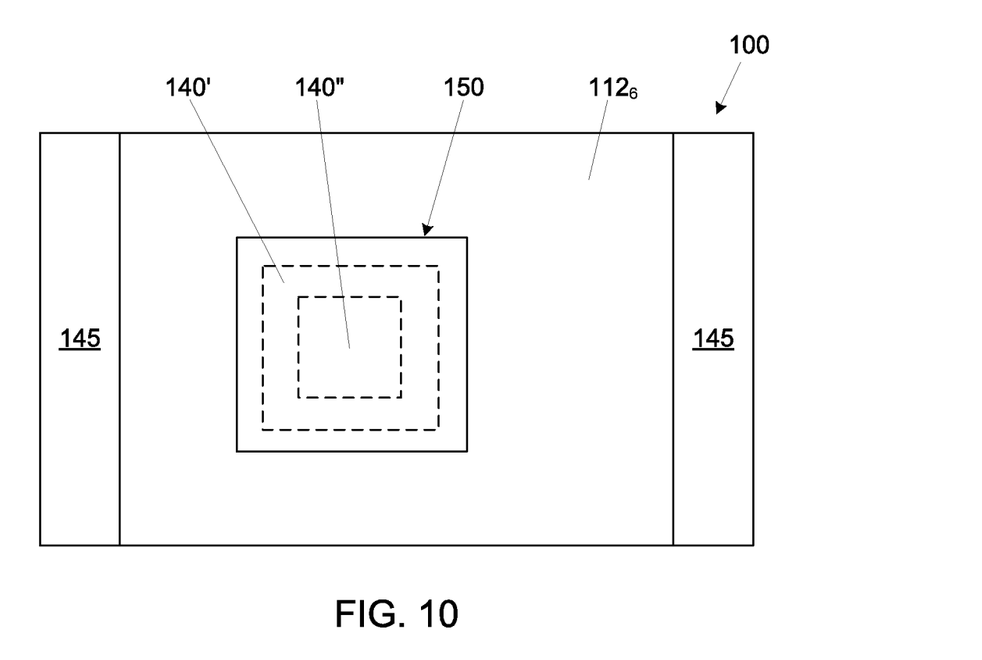
Figure 11:
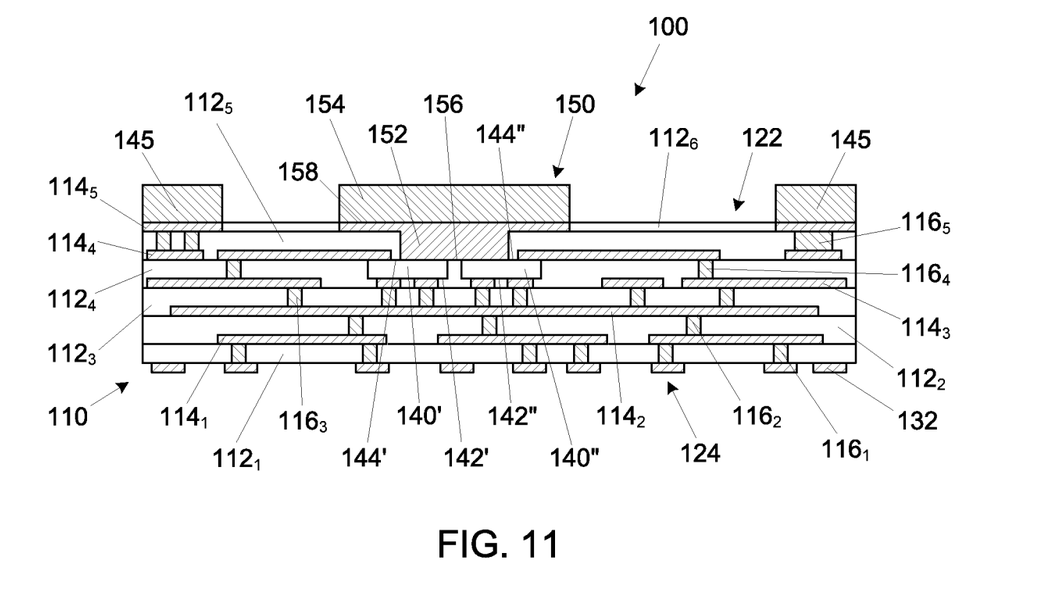
FIGS. 11 and 12 are a side cross-sectional view and a top view, respectively, of integrated circuit structures having multiple integrated circuit devices embedded in a substrate, wherein a heat dissipation device is formed to extend into the substrate to thermally contact the integrated circuit devices, according to an embodiment of the present description.
Figure 12:
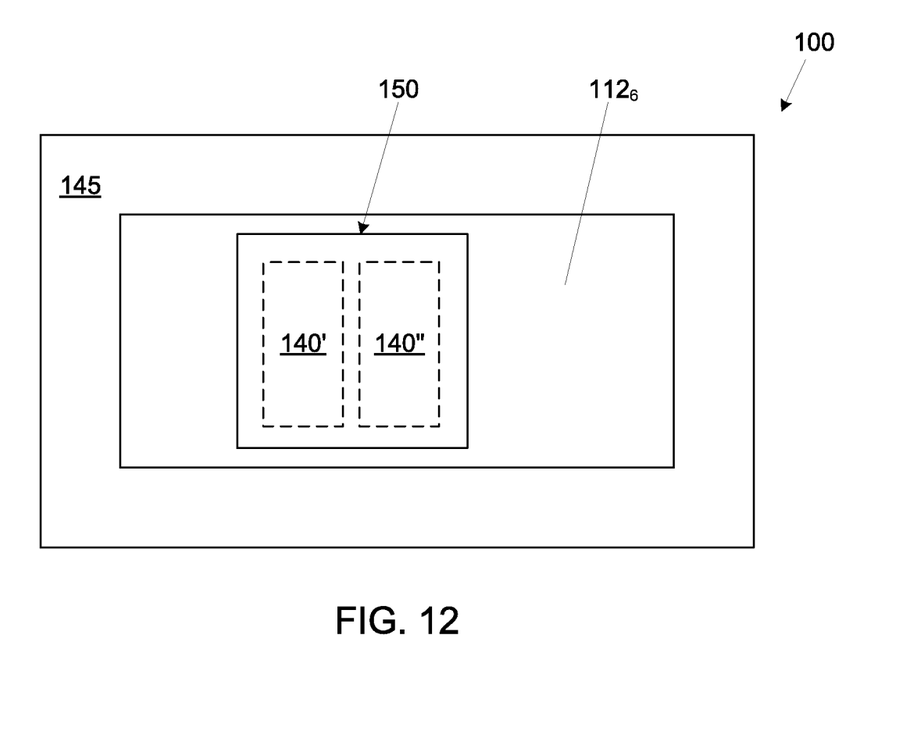

Embodiments of the present description are not limited to a single integrated circuit device 140, but may include multiple integrated circuit devices illustrated in FIGS. 9-12. In one embodiment, as shown in FIGS. 9 (cross sectional view) and 10 (top plan view), an integrated circuit device stack, comprising a first integrated circuit device 140' and a second integrated circuit device 140", may be embedded in the substrate 110. The second integrated circuit device 140" may be stacked on and in electrical communication with the first integrated circuit device 140'. In another embodiment, as shown in FIGS. 11 (cross sectional view) and 12 (top plan view), the first integrated circuit device 140' and a second integrated circuit device 140" may be positioned side-by-side.

The stiffener structure 145 may have any appropriate shape. In one embodiment shown in FIG. 9, the stiffener structure 145 may comprise multiple structures on opposing sides of the integrated circuit package 100. In another embodiment shown in FIG. 11, the stiffener structure 145 may comprise a single structure, such as picture frame shape, tracking the edge of the integrated circuit package 100.

Figure 13:
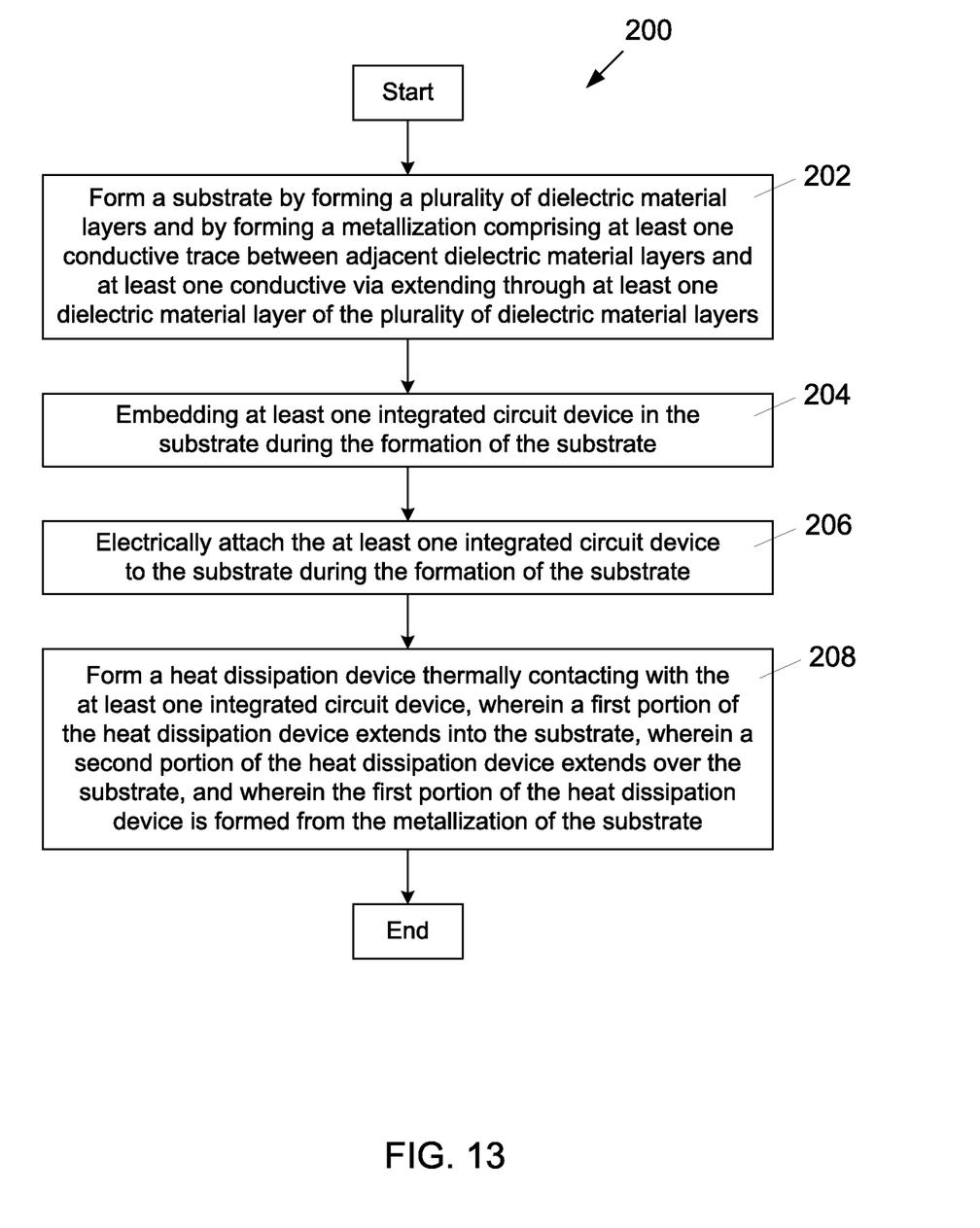
FIG. 13 is a flow diagram of a method of fabricating an integrated circuit structure, according to one embodiment of the present description.

FIG. 13 is a flow chart of a process 200 of fabricating an integrated circuit structure according to an embodiment of the present description. As set forth in block 202, a substrate may be formed by forming a plurality of dielectric material layers and by forming a metallization comprising at least one conductive trace between adjacent dielectric material layers and at least one conductive via extending through at least one dielectric material layer of the plurality of dielectric material layers. At least one integrated circuit device may be embedded in the substrate during the formation of the substrate, as set forth in block 204. As set forth in block 206, the at least one integrated circuit device may be electrically attached to the substrate during the formation of the substrate. A heat dissipation device may be formed thermally contacting the at least one integrated circuit device, wherein a first portion of the heat dissipation device extends into the substrate, wherein a second portion of the heat dissipation device extends over the substrate, and wherein the first portion of the heat dissipation device is formed from the metallization of the substrate, as set forth in block 208.

Figure 14:
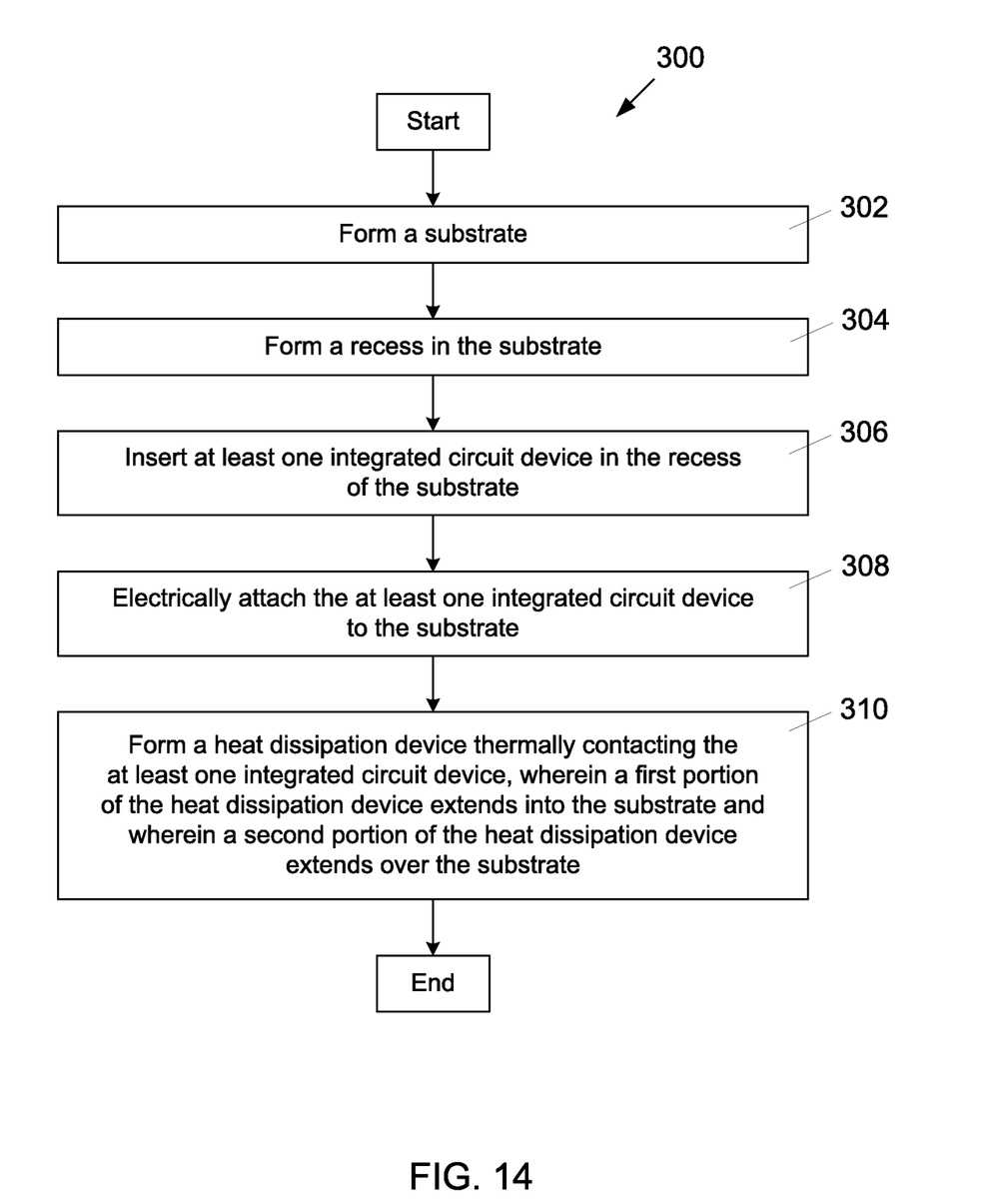
FIG. 14 is a flow diagram of a method of fabricating an integrated circuit structure, according to another embodiment of the present description.

FIG. 14 is a flow chart of a process 300 of fabricating an integrated circuit structure according to an embodiment of the present description. As set forth in block 302, a substrate may be formed. A recess may be formed in the substrate, as set forth in block 304. As set forth in block 306, at least one integrated circuit device inserted in the recess of the substrate. The at least one integrated circuit device may be electrically attached to the substrate, as set forth in block 308. As set forth in block 310, a heat dissipation device may be formed thermally contacting the at least one integrated circuit device, wherein a first portion of the heat dissipation device extends into the substrate and wherein a second portion of the heat dissipation device extends over the substrate.

Figure 15:
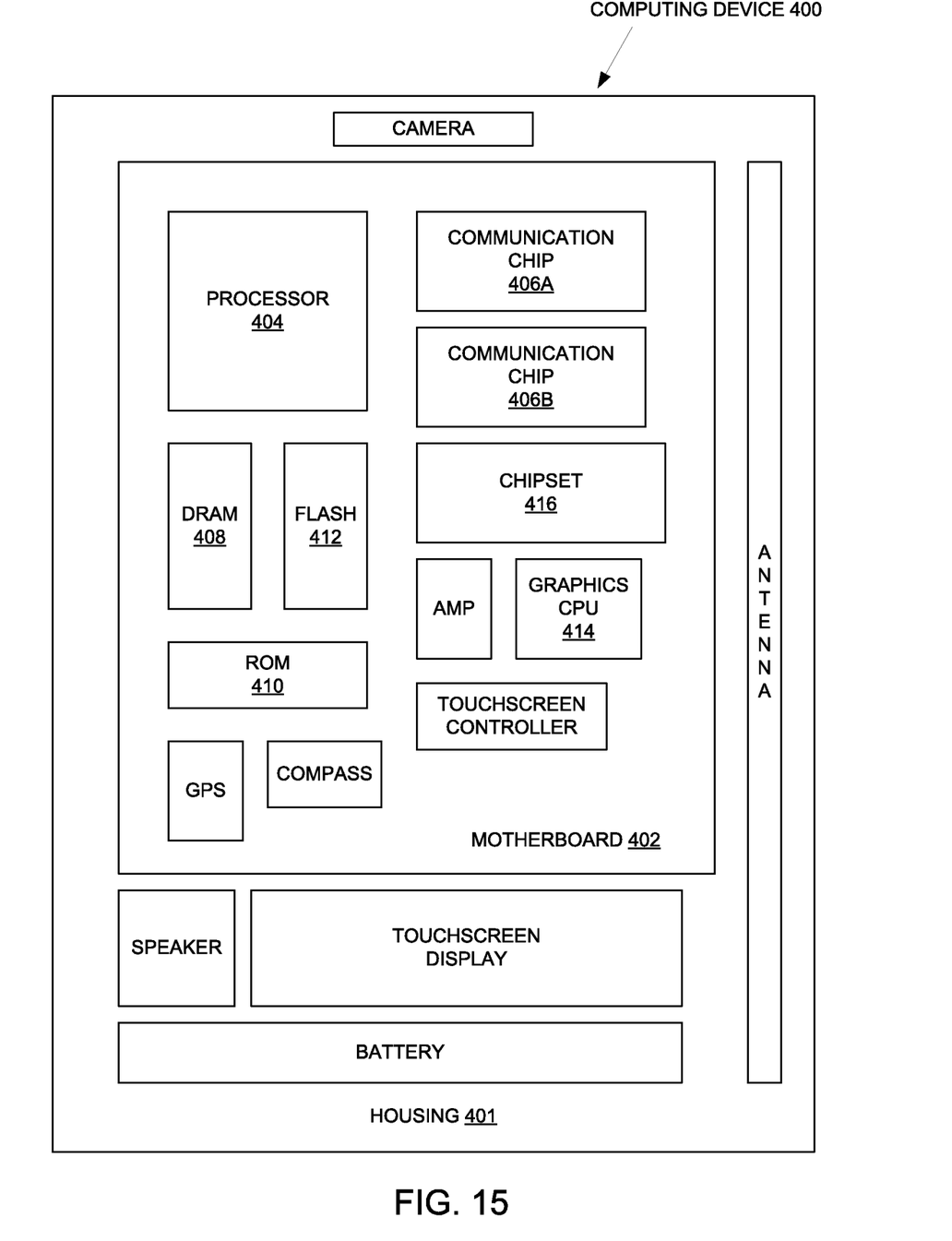
FIG. 15 is an electronic device/system, according to an embodiment of the present description.

FIG. 15 illustrates an electronic or computing device 400 in accordance with one implementation of the present description. The computing device 400 may include a housing 401 having a board 402 disposed therein. The board 402 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit structure comprising a substrate, an integrated circuit device embedded in and electrically attached to the substrate; and a heat dissipation device in thermal contact with the integrated circuit device, wherein a first portion of the heat dissipation device extends into the substrate and wherein a second portion of the heat dissipation device extends over the substrate.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-15. The subject matter may be applied to other integrated circuit devices and assembly applications, as well as any appropriate electronic application, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit package, comprising:
   a substrate comprising a plurality of dielectric layers and metallization comprising at least one conductive trace between adjacent ones of the dielectric layers;
   at least one integrated circuit device embedded in and electrically attached to the substrate;

a heat dissipation device over, and in thermal contact with, the at least one integrated circuit device, wherein a first portion of the heat dissipation device extends into the substrate and wherein a second portion of the heat dissipation device extends over a portion of the substrate beyond an edge of the at least one integrated circuit device; and a stiffener structure in direct contact with the substrate, wherein the stiffener structure is laterally adjacent to, and coplanar with, the second portion of the heat dissipation device.

2. The integrated circuit package of claim 1, wherein the metallization comprises at least one conductive via extending through at least one of the plurality of dielectric layers.

3. The integrated circuit package of claim 2, wherein the first portion of the heat dissipation device has the same composition as the metallization within the substrate.

4. The integrated circuit assembly of claim 2, wherein a portion of the stiffener structure is in contact with the metallization within the substrate.

5. The integrated circuit package of claim 1, wherein the substrate includes a recess and the at least one integrated circuit device is within the recess and electrically attached to the substrate with a plurality of interconnects.

6. The integrated circuit package of claim 1, further comprising a barrier layer between the at least one integrated circuit device and the heat dissipation device.

7. The integrated circuit package of claim 1, wherein the at least one integrated circuit device comprises a first surface and an opposing second surface and wherein the first surface and the second surface are both electrically attached to the substrate.

8. The integrated circuit package of claim 1, wherein the stiffener is laterally adjacent to the heat dissipation device and extends along at least two opposite edges of the substrate.

9. The integrated circuit package of claim 1, wherein the stiffener comprises the same metallization as at least the second portion of the heat dissipation device.

10. The integrated circuit package of claim 1, wherein the stiffener is continuous along about a perimeter of the substrate.

11. An electronic system, comprising:
a board;
a microelectronic package electrically attached to the board, wherein the package comprises at least one integrated circuit device embedded in and electrically attached to a substrate comprising a plurality of dielectric layers and metallization comprising at least one conductive trace between adjacent ones of the dielectric layers, a heat dissipation device over, and in thermal contact with, the at least one integrated circuit device, wherein a first portion of the heat dissipation device extends into the substrate and wherein a second portion of the heat dissipation device extends over a portion of the substrate beyond an edge of the at least one integrated circuit device; and a stiffener structure in direct contact with the substrate and laterally adjacent to, and co-planar with, the second portion of the heat dissipation device.

12. The electronic system of claim 11, wherein the metallization comprises at least one conductive via extending through at least one dielectric layer of the plurality of dielectric layers.

13. The electronic system of claim 12, wherein the first portion of the heat dissipation device comprises the metallization within the substrate.

14. The electronic system of claim 12, wherein a portion of the stiffener structure is in contact with the metallization within the substrate.

15. The electronic system of claim 11, wherein the substrate includes a recess wherein the at least one integrated circuit device is within the recess and electrically attached to the substrate with a plurality of interconnects.

16. The electronic system of claim 11, wherein the at least one integrated circuit device comprises a first surface and an opposing second surface and wherein the first surface and the second surface are both electrically attached to the substrate.

* * * * *